(12) United States Patent
Kim et al.

(10) Patent No.: US 10,957,837 B2
(45) Date of Patent: Mar. 23, 2021

(54) LIGHT SOURCE DEVICE AND DISPLAY DEVICE

(71) Applicant: LG DISPLAY CO., LTD., Seoul (KR)

(72) Inventors: Dong-Young Kim, Paju-si (KR); Osamu Sato, Tokyo (JP); Kazuki Watanabe, Tokyo (JP)

(73) Assignee: LG DISPLAY CO., LTD., Seoul (KR)

( * ) Notice: Subject to any disclaimer, the term of this patent is extended or adjusted under 35 U.S.C. 154(b) by 241 days.

(21) Appl. No.: 16/126,603

(22) Filed: Sep. 10, 2018

(65) Prior Publication Data

US 2019/0027668 A1    Jan. 24, 2019

Related U.S. Application Data

(63) Continuation of application No. 15/694,145, filed on Sep. 1, 2017, now Pat. No. 10,103,307.

(30) Foreign Application Priority Data

Sep. 1, 2016   (JP) .............................. JP2016-170604

(51) Int. Cl.
    *H01L 33/64*     (2010.01)
    *G02F 1/13357*     (2006.01)
    *H01L 33/50*     (2010.01)
    *G02F 1/1333*     (2006.01)

(52) U.S. Cl.
    CPC ...... *H01L 33/641* (2013.01); *G02F 1/133603* (2013.01); *H01L 33/502* (2013.01); *G02F 1/133308* (2013.01); *G02F 2001/133612* (2013.01); *G02F 2001/133614* (2013.01); *G02F 2001/133628* (2013.01); *G02F 2202/36* (2013.01)

(58) Field of Classification Search
    CPC ..... H01L 33/641; H01L 33/502; H01L 33/50; G02F 1/133603; G02F 2001/133614; G02F 1/133308; G02F 2001/01791
    See application file for complete search history.

(56) References Cited

U.S. PATENT DOCUMENTS

2005/0253153 A1*   11/2005   Harada ................. H01L 33/644
    257/79
2009/0322208 A1*   12/2009   Shaikevitch .......... H01L 33/507
    313/503

(Continued)

FOREIGN PATENT DOCUMENTS

| JP | 2006-100687 A | 4/2006 |
| JP | 2013-74273 A | 4/2013 |

(Continued)

*Primary Examiner* — Evan P Dzierzynski
(74) *Attorney, Agent, or Firm* — Birch, Stewart, Kolasch & Birch, LLP (57) ABSTRACT

A light source device can include a frame including a bottom wall and a side wall surrounding the bottom wall; a light source on the bottom wall; a wavelength converting structure disposed over the light source and including wavelength converting mediums therein; and a first heat sink disposed at a side of the frame to be opposite to the wavelength converting structure, in which the wavelength converting structure is disposed on and directly contacts a top surface of the side wall of the frame.

34 Claims, 3 Drawing Sheets

(56) References Cited

U.S. PATENT DOCUMENTS

| | | | | |
|---|---|---|---|---|
| 2011/0215698 A1* | 9/2011 | Tong | .......................... | F21V 3/02 |
| | | | | 313/46 |
| 2012/0032578 A1* | 2/2012 | Annen | .................. | C09K 11/883 |
| | | | | 313/483 |
| 2014/0151729 A1* | 6/2014 | Orsley | .................. | H01L 33/504 |
| | | | | 257/98 |
| 2014/0226308 A1* | 8/2014 | Fukuda | ................. | F21V 31/005 |
| | | | | 362/84 |
| 2015/0345745 A1* | 12/2015 | Asadi | ........................ | F21V 9/38 |
| | | | | 362/84 |
| 2017/0122527 A1* | 5/2017 | Miyanaga | ......... | G02F 1/133603 |

FOREIGN PATENT DOCUMENTS

| | | |
|---|---|---|
| JP | 2015-233057 A | 12/2015 |
| JP | 2016-76634 A | 5/2016 |
| JP | 2016-127145 A | 7/2016 |
| KR | 10-2016-0041752 A | 4/2016 |
| WO | WO 2015/156227 A1 | 10/2015 |

\* cited by examiner

LIGHT SOURCE DEVICE AND DISPLAY DEVICE

This application is a Continuation of U.S. patent application Ser. No. 15/694,145 filed on Sep. 1, 2017, which claims the priority benefit of Japanese Patent Application No. 2016-170604 filed in Japan on Sep. 1, 2016, all of these applications are hereby expressly incorporated by reference into the present application.

BACKGROUND OF THE INVENTION

Field of the Invention

The present invention relates to a light source device and a display device.

Discussion of the Background Art

Recently, to provide a liquid crystal display device that can display an image with good color reproduction, a research of a technology that raises a color purity of a light incident on a liquid crystal display element has been required. For example, a technology using a quantum dot has been developed. The quantum dot is a fluorescent substance, and when an excitation light is incident from a light source such as a light emitting diode (LED), the quantum dot produces a light of a wavelength longer than a wavelength of the excitation light. By changing a type and a diameter of the quantum dot, a wavelength of a light produced by the quantum dot can be adjusted. For example, the quantum dot is configured such that it uses a blue light as an excitation light from an LED and produces a green light and a red light, which are narrow in full width at half maximum, when the blue light is incident. Accordingly, by using the quantum dot, a light source, of high efficiency, which is capable of producing a light of a narrow wavelength region corresponding to three primary colors of light can be realized.

The quantum dot is prone to a deterioration when being exposed to water, oxygen and heat. A technology described in Japanese Patent Application Publication No. 2016-76634 (referred to herein below as patent literature 1) seals quantum dots, dispersed in a resin or organic solvent, inside a container (or vessel) having a barrier property to water and oxygen. By this configuration, a deterioration of a light source device including the quantum dots is suppressed and reliability can be improved.

The container sealing the quantum dots is prone to accumulate heat produced by a non-radiative deactivation or the like. Accordingly, a quantum dot deterioration caused by the accumulated heat at the container may happen. However, the technology in the patent literature 1 is capable of suppressing a deterioration by water and oxygen but does not consider a deterioration by a heat.

SUMMARY OF THE INVENTION

Accordingly, the present invention is directed to a light source device and a display device that can suppress a quantum dot deterioration by a heat.

Additional features and advantages of the disclosure will be set forth in the description which follows, and in part will be apparent from the description, or may be learned by practice of the disclosure. The advantages of the disclosure will be realized and attained by the structure particularly pointed out in the written description and claims as well as the appended drawings.

To achieve these and other advantages, and in accordance with the purpose of the present invention, as embodied and broadly described herein, a light source device includes a substrate; a light source portion supported on the substrate and producing a light; a container supported on the light source portion and containing quantum dots excited by the light; and a thermal conductor connecting the container with the substrate.

In another aspect, a display device includes the above light source device and a liquid crystal panel supplied with a light from the light source device.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION OF THE EMBODIMENTS

Reference will now be made in detail to embodiments, examples of which are illustrated in the accompanying drawings. The same or like reference numbers may be used throughout the drawings to refer to the same or like parts.

First Embodiment

Figure 1:
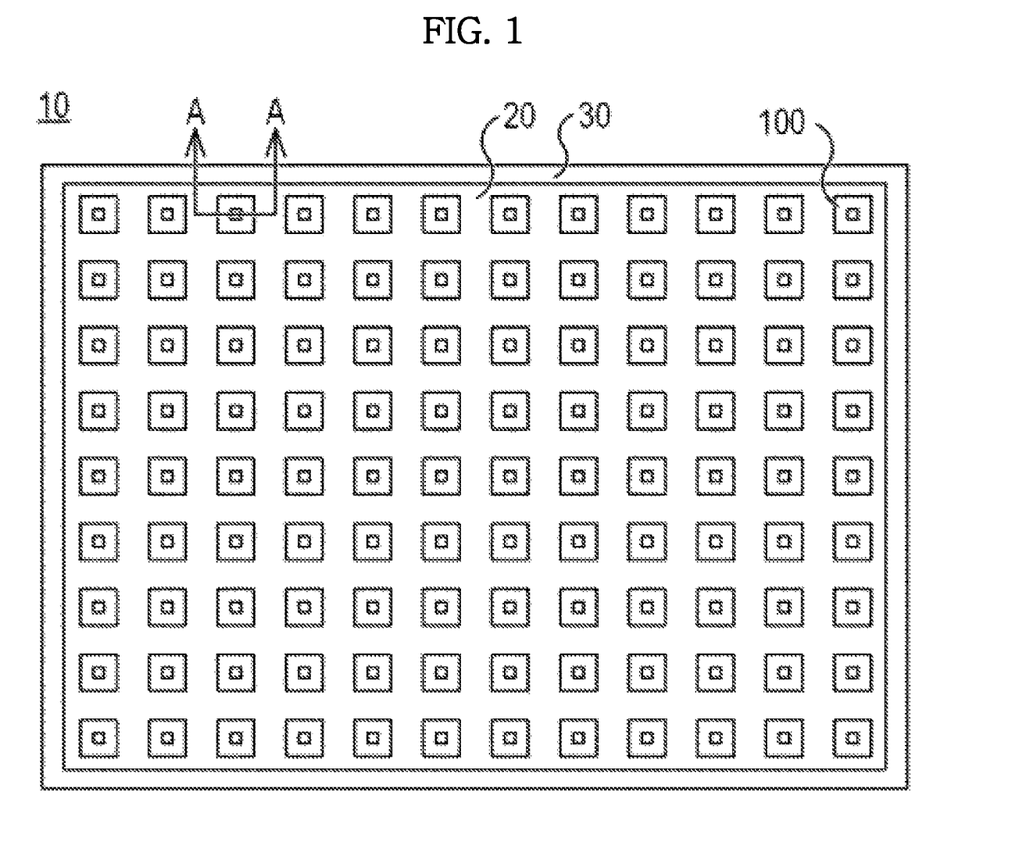
FIG. 1 is a front view illustrating a display device according to a first embodiment of the present invention.

FIG. 1 is a front view illustrating a display device according to a first embodiment of the present invention. All the components of the display device according to all embodiments of the present invention are operatively coupled and configured.

Referring to FIG. 1, the display device 10 includes a liquid crystal panel 20, light source devices 100 arranged over a rear surface of the liquid crystal panel 20, and a frame 30 supporting the liquid crystal panel 20 and the light source devices 100. In FIG. 1, it is shown that the light source devices 100 at the rear of the liquid crystal panel 20 are transmitted and seen through liquid crystal panel 20 for the sake of visibility. A number and a size of each of portions included in the display device 10 does not consider real components, and may be designed appropriately according to a real installation method.

The light source devices 100 serve as a direct type backlight unit, and radiate a light to the liquid crystal panel 20 from a rear side of the liquid crystal panel 20. A detailed configuration of the light source devices 100 is explained below with reference to FIGS. 2 and 3. The liquid crystal panel 20 may include known components that include a liquid crystal layer, a polarizing plate, a color filter, an electric circuit such as a thin film transistor (TFT) and so on. The liquid crystal panel 20 controls tranmissivity of light, from the light source devices 100, for each pixel using the electric circuit of each pixel, and display a desired image. The frame 30 is formed using a resin, metal or so on, and supports the liquid crystal panel 20 and the light source devices 100. Electric wirings to the liquid crystal panel 20 and the light source devices 100 are installed in the frame 30. In this embodiment, the direct type backlight unit is described as a backlight unit by way of example, but an edge type backlight unit may be used.

Figure 2:
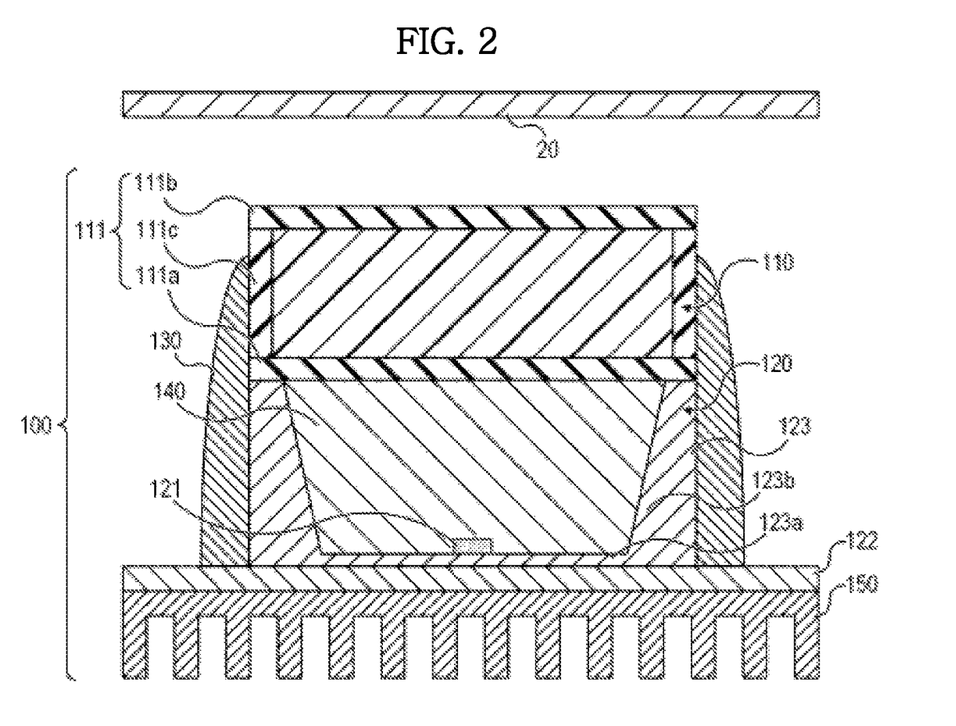
FIG. 2 is a cross-sectional view illustrating the display device according to the first embodiment of the present invention.

FIG. 2 is a cross-sectional view, along a line A-A of FIG. 1, of the display device according to the first embodiment of the present invention. The light source device 100 includes a light source portion 120 producing a light of a predetermined wavelength and a quantum dot structure 110 converting a wavelength of a light from the light source portion 120.

The light source portion 120 includes a light emitting element 121, a substrate 122 and a frame 123. The light emitting element 121 produces a light of a predetermined wavelength and radiates the light to the liquid crystal panel 20. The light emitting element 121 is electrically connected to an electric wiring, and produces a light using a power applied through the electric wiring. A wavelength of the light produced by the light emitting element 121 is, for example, within a wavelength region of a blue light (e.g., about 380 nm~500 nm) or a wavelength region of a ultraviolet (UV) light (e.g., about 10 nm~380 nm). The light emitting element 121 may use a light emitting diode (LED), an organic light emitting diode (OLED) or the like. As the light from the light emitting element 121 is incident, as an excitation light, on the quantum dot structure 110, and the light source device 100 can produce a light of a narrow wavelength region corresponding to three primary colors of light.

The frame 123 has a concave shape, and includes a bottom wall 123a and a side wall 123b surrounding the bottom wall 123a. The light emitting element 121 is supported on the bottom wall 123a, and the quantum dot structure 110 is supported on the side wall 123b. an inside region enclosed by the bottom wall 123a and the side wall 123b is formed between the quantum dot structure 110 and the light emitting element 121, and a light from the light emitting element 121 to the quantum dot structure 110 passes through the inside region. To improve a heat radiation property, the bottom wall 123a and the side wall 123b of the frame 123 is formed using a thermal conductor such as a high thermally conductive resin. The high thermally conductive resin may be, for example, a mixture of a thermally conductive filler, such as an organic particle, with a resin, such as carbonate or nylon. Alternatively, the thermal conductor may use other material, such as metal or semiconductor, of a high thermal conductivity.

The substrate 122 extends in parallel with a surface of the liquid crystal panel 20, and supports the light emitting elements 121 and the frames 123. In this embodiment, a predetermined number of light emitting elements 121 and frames 123 are arranged in a lattice manner and at an equidistant interval from each other, on the substrate 122. A number of and an arrangement of the light emitting elements 121 and frames 123 may be set appropriately according to a configuration of the display device 10. The substrate 122 may be formed using a resin, metal, semiconductor or the like.

Figure 3:
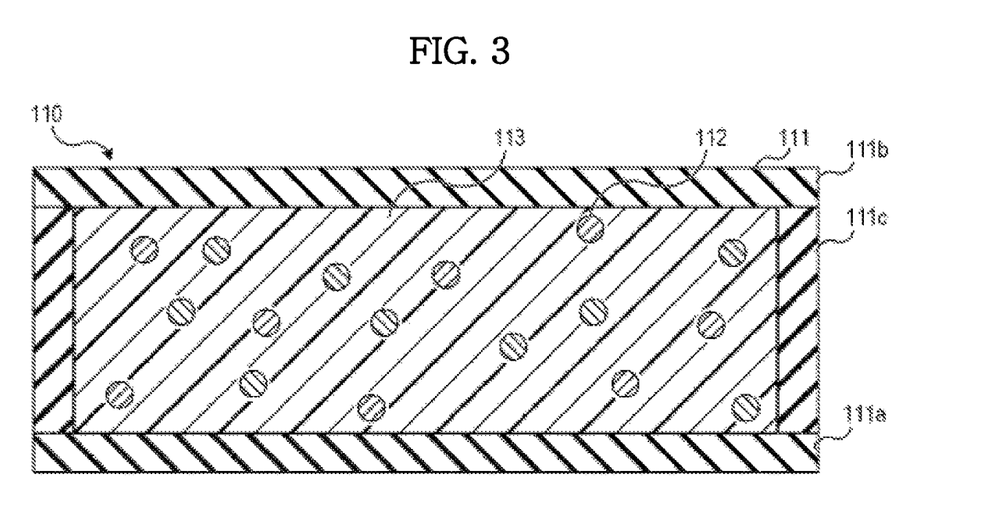
FIG. 3 is a cross-sectional view illustrating a quantum dot structure according to the first embodiment of the present invention.

The quantum dot structure 110 is located between the rear surface of the liquid crystal panel 20 and the light source portion 120, and is interposed on a path of a light from the light source portion 120 to the rear surface of the liquid crystal panel 20. The light from the light source portion 120 radiates to the rear surface of the liquid crystal panel 20 through the quantum dot structure 110. FIG. 3 is a detailed cross-sectional view, along a line A-A of FIG. 1, of the quantum dot structure according to the first embodiment of the present invention. The quantum dot structure 110 includes an airtight container (or airtight vessel), and quantum dots 112 and a dispersion medium 113 contained in the airtight container 111. The dispersion medium 113 is a medium in a liquid or solid phase to uniformly disperse the quantum dots 112 and is formed using a material, such as a resin or the like, transmitting a light of at least a visible light wavelength region (e.g., about 380 nm~780 nm).

The airtight container 111 has a container that has an inside region isolated from an outside space, and is formed using a material, such as a resin, glass or the like, transmitting a light of at least a visible light wavelength region. To suppress a deterioration of the quantum dot 112 by water and oxygen, it is preferable that the airtight container 111 is formed using a material having a barrier property to water and oxygen.

In this embodiment, the airtight container 111 is configured by a glass cell that is formed using a glass having a high barrier property to water and oxygen. In detail, the airtight container 111 has a structure, a quadrangular prism shape, that a bottom wall 111a and a top wall (or ceiling wall) 111b, which are glass rectangular plates parallel with each other, face each other at a predetermined interval with a side wall 111c interposed therebetween. The light from the light source portion 120 is incident perpendicularly to the bottom wall 111a. The airtight container 111 is not limited to the structure described by way of example in this embodiment but may use a known structure (e.g., see Japanese Patent Application Publication No. 2015-233057, also referred to herein as patent literature 2). A shape of the airtight container 111 may be, for example, other shape such as a cylindrical shape. At least a part of a side wall of the airtight container 111 may have a curved shape rather than a plan shape.

The quantum dot 112 (which may be referred to as a colloidal quantum dot) is a nano-scale material that has an optical property according to a quantum mechanics, and is a minute semiconductor particle that has a diameter of about 1 nm~100 nm, preferably 1 nm~50 nm, more preferably 1 nm~20 nm. The quantum dot 112 absorbs a photon that has an energy greater than a band gap (i.e., an energy difference between a valance band and a conduction band), and emits a light of a wavelength according to its diameter. Accordingly, the quantum dot 112 has a property of absorbing a light of a predetermined wavelength or less and can produce a light of a predetermined wavelength by adjusting the diameter. In this embodiment, the quantum dot 112 has a spherical shape by way of example, but it may have other shape.

The quantum dot 112 includes at least one semiconductor material. As the semiconductor material, a IV group atom, II-VI group compound, II-V compound, III-VI compound, III-V compound, IV-VI compound, group compound, II-IV-VI compound, II-IV-V compound or the like may be used. In detail, as the semiconductor material of the quantum dot 112, ZnO, ZnS, ZnSe, ZnTe, CdO, CdS, CdSe, CdTe, MgS, MgSe, GaAs, GaN, GaP, GaSe, GaSb, HgO, HgS, HgSe, HgTe, InAs, InN, InP, InSb, AlAs, AlN, AlP, AlSb, TiN, TiP, TiAs, TiISb, PbO, PbS, PbSe, PbTe, Ge, Si or the like may be used. However, the quantum dot 112 is not limited to the above material, but may use other material sufficient to achieve the ability of the quantum dot 112.

When a light produced by the light source portion 120 is a blue light, a first quantum dot 112, which has a light-emission center wavelength at a wavelength region of a green light (e.g., 510 nm~610 nm, preferably 520 nm~580 nm), and a second quantum dot 112, which has a light-emission center wavelength at a wavelength region of a red light (e.g., 600 nm~700 nm, preferably 610 nm~680 nm), are combined and used. In other words, the blue light from the light source portion 120 functions as an excitation light for the quantum dot 112 and also functions as a visible light emitted from the light source device 100. In this embodiment, a light source having a light-emission spectrum with 3 maxima of red, green and blue colors is described, but combination of light-emission center wavelengths and quantum dots is not limited and other combination may be used.

When a light produced by the light source portion 120 is a UV light, a first quantum dot 112 having a light-emission center wavelength at a wavelength region of a green light, a second quantum dot 112 having a light-emission center wavelength at a wavelength region of a red light, and a third quantum dot 112 having a light-emission center wavelength at a wavelength region of a blue light are combined and used. In other words, the UV light from the light source portion 120 functions as an excitation light for the quantum dot 112.

The quantum dot 112 may has a core-shell type structure that has a core including at least one semiconductor material, and a shell including at least one semiconductor material.

In detail, a quantum dot 112 using CdSe as a core and CdZnS as a shell, a quantum dot 112 using CdZnSe as a core and CdZnS as a shell, and a quantum dot 112 using CdS as a core and CdZnS as a shell may be used.

Referring back to FIG. 2, means that realize an effective heat radiation in the light source device 100 according to this embodiment are explained. To achieve a heat radiation from the quantum dot structure 110, the light source device 100 includes a high thermally conductive cladding member 130 covering around the side wall 111c of the quantum dot structure 110, and a high thermally conductive filler 140 filling the inside region of the frame 123 of the light source portion 120. Each of the high thermally conductive cladding member 130 and the high thermally conductive filler 140 thermally connects the quantum dot structure 110 with the substrate 122 of the light source portion 120, and transfers heat from the quantum dot structure 110 to the substrate 122.

In detail, the high thermally conductive cladding member 130 connects the side wall 111c with the surface of the substrate 122. To promote a heat transfer from the quantum dot structure 110 to the high thermally conductive cladding member 130, the high thermally conductive cladding member 130 contacts a ⅓ or greater, in a height direction, of the side wall 111c, preferably a half or greater, in a height direction, of the side wall 111c, and more preferably all, in a height direction, of the side wall 111c. The high thermally conductive cladding member 130 contacts at least a part, in a perimeter direction, of the side wall 111c, and preferably all, in a perimeter direction, of the side wall 111c. To increase an amount of heat radiation from the high thermally conductive cladding member 130 itself, it is preferable that the high thermally conductive cladding member 130 has an unevenness (e.g., concavo-convex pattern) at a surface thereof to increase a surface area.

In this embodiment, the high thermally conductive cladding member 130 may be formed by coating a high thermally conductive paste, which is obtained by making a thermal conductor into a paste phase, on surfaces of the side wall 111 of the quantum dot structure 110, the side wall 123b of the light source portion 120, and the substrate 122 such that the paste continuously contacts the surfaces of the side wall 111 of the quantum dot structure 110, the side wall 123b of the light source portion 120, and the substrate 122. The thermal conductor of the high thermally conductive cladding member 130 may use a metal, semiconductor, or above-described high thermally conductive resin. By this configuration, the heat produced at the quantum dot structure 110 is transferred from the side wall 111c of the quantum dot structure 110 to the substrate 122 via the high thermally conductive cladding member 130, and then is emitted from the substrate 122.

The high thermally conductive filler 140 connects the bottom wall 111a of the quantum dot structure 110 with the bottom wall 123a of the light source portion 120. To suppress a loss of light from the light emitting element 121, it is preferable that the high thermally conductive filler 140 fully fills the inside region enclosed by the bottom wall 123a and the side wall 123b of the light source portion 120 and there is no space on a light path from the light emitting element 121 to the quantum dot structure 110.

In this embodiment, the high thermally conductive filler 140 is formed by filling the inside region, enclosed by the bottom wall 123a and the side wall 123b of the light source portion 120, with a thermal conductor. The thermal conductor of the high thermally conductive filler 140 may use an inorganic material, which transmits a wavelength region of a light from the light emitting element 121, a high thermally conductive resin and so on. Since the frame 122 of the light source portion 120 usually has a heat transfer amount greater than an atmosphere, a heat from the high thermally conductive filler 140 is easily conducted to the substrate 122. By this configuration, the heat produced at the quantum dot structure 110 is transferred from the bottom wall 111a of the quantum dot structure 110 to the substrate 122 via the high thermally conductive filler 140 and the frame 123 of the light source portion 120, and then is emitted from the substrate 122.

Further, a heat sink 150, which is a heat radiation portion from the substrate 122, is installed at the substrate 122. The heat sink 150 has uneven patterns at a surface thereof and is a member to increase a heat radiation property. To increase an installation area of the heat sink 150, it is preferable that the heat sink 150 is installed at a side, opposite to the quantum dot structure 110, of the substrate 122. A heat, which is conducted from the quantum dot structure 110 to the substrate 122 through the high thermally conductive cladding member 130 and the high thermally conductive filler 140, is further effectively emitted from the heat sink 150 of the substrate 122. Besides the heat sink 150, the heat radiation portion from the substrate 122 may use other structure, for example, a heat radiation paint coated on the surface of the substrate 122. Further, by forming uneven patterns at the surface of the, the substrate 122 itself may function as the heat radiation portion.

Since the substrate 122 of the light source portion 120 has a large area, the substrate 122 has a heat radiation property greater than the airtight container 111 of the quantum dot structure 110. The heat radiation property of the substrate 122 further rises because of the heat sink 150. Accordingly, according to the light source device 100 of the embodiment, since the heat produced at the quantum dot structure 110 is transferred to the substrate 122 using the high thermally conductive cladding member 130 and the high thermally conductive filler 140, the heat radiation amount from the quantum dot structure 110 can increase and a deterioration of the quantum dot 112 by a heat can be suppressed.

In this embodiment, by both of the high thermally conductive cladding member 130 and the high thermally conductive filler 140, the quantum dot structure 110 and the substrate 122 are thermally connected. However, even when employing one of the high thermally conductive cladding member 130 and the high thermally conductive filler 140, the effect of this embodiment can be also achieved.

Example of Present Invention

An acceleration test for an example of this embodiment that is the light source device 100 described above is conducted. Further, an acceleration test for a first comparative example that omits the high thermally conductive cladding member 130 and the heat sink 150 from the light source device 100, and an acceleration test for a second comparative example that omits the high thermally conductive cladding member 130 from the light source device 100 are conducted. A condition for the acceleration tests is that the light emitting diode 100 is fabricated using an LED having a center wavelength of 450 nm as the light emitting element 121, and the LED is turned on at an environmental temperature of 85 degrees Celsius. A total luminous flux for a state before an LED turn-on and a total luminous flux for a state after 70 hours are measured, and a luminous flux maintenance factor between the states is calculated. The luminous flux maintenance factor is expressed as a relative value with respect to the first comparative example of 100%, and as the higher maintenance factor is considered better because a deterioration of the quantum dot becomes more suppressed. Further, a visual inspection for each of the example of this embodiment, the first comparative example, and the second comparative example is conducted. The visual inspection is to evaluate how much a color of the quantum dot 112 and the dispersion medium 113 becomes black by a deterioration. The measuring results are shown in Table 1.

TABLE 1

| | Luminous flux maintenance factor (relative value with respect to the first comparative example) | Visual inspection |
|---|---|---|
| Example of this embodiment (with high thermally conductive cladding member and heat sink) | 133 | Very good |
| 1st comparative example (without high thermally conductive cladding member and heat sink) | 100 | Bad |
| 2nd comparative example (without high thermally conductive cladding member and with heat sink) | 108 | Good |

As shown in Table 1, the example of this embodiment has the luminous flux maintenance factor improved significantly compared with the first comparative example without the high thermally conductive cladding member 130 and the heat sink 150. Further, the example of this embodiment has the luminous flux maintenance factor improved compared with the second comparative example with the heat sink 150 installed on the rear surface of the substrate 122. Regarding the deterioration evaluation of the quantum dot by the visual inspection, the example of this embodiment is better than the first and second comparative examples. Therefore, it is established that installing the high thermally conductive cladding member 130, which connects the quantum dot structure 110 and the substrate 122, is effective to improvements of heat radiation property and reliability of the quantum dot structure 110.

Second Embodiment

Figure 4:
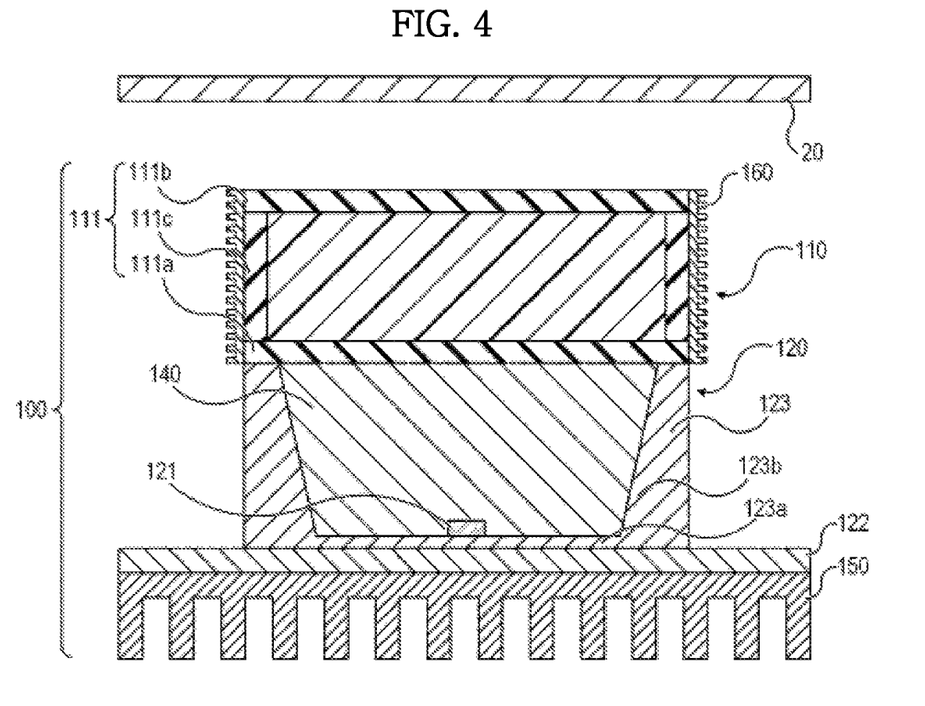
FIG. 4 is a cross-sectional view illustrating the display device according to a second embodiment of the present invention.

FIG. 4 is a cross-sectional view, along a line A-A of FIG. 1, of a display device according to a second embodiment of the present invention. A configuration of a quantum dot structure 110 of this embodiment is different from that of the first embodiment. Except for the configuration of the quantum dot structure 110, this embodiment is substantially identical to the second embodiment.

In the display device 10 of this embodiment, the high thermally conductive cladding member 130 is omitted, and instead of this, a heat sink 160 as a heat radiation portion from the quantum dot structure 110 is installed on a surface of the side wall 111c of the quantum dot structure 110. The heat sink 160 has uneven patterns at a surface thereof and is thus a member raising a heat radiation property. Further, by installing the uneven patterns on the surface of the side wall 111c of the quantum dot structure 110, the side wall 111c itself may serve as a heat radiation portion. A means to serve the side wall 111c itself as a heat radiation portion is not limited to the uneven patters at the surface, but may use other structure, for example, a heat radiation paint coated on the surface.

As a heat radiation portion from the quantum dot structure 110, instead of the heat sink 160, an air-cooling or water-cooling device may be installed, which performs a forced air cooling by circulating a gas or liquid in a circulation pipe installed an inside or surface of the bottom wall 111a, top wall 111b or side wall 111c of the airtight container 111.

According to the display device 10 of this embodiment, since the heat produced at the quantum dot structure 110 is transferred to the substrate 122 using the high thermally conductive filler 140 and is also emitted from the heat sink 160 installed at the quantum dot structure 110, the heat radiation amount from the quantum dot structure 110 can increase and a deterioration of the quantum dot 112 by a heat can be suppressed.

With a combination of the first and second embodiments, both of the high thermally conductive cladding member 130 and the heat sink 160 may be installed at the side wall 111c of the quantum dot structure 110. Accordingly, the heat radiation amount from the quantum dot structure 110 can further increase.

It will be apparent to those skilled in the art that various modifications and variations can be made in a display device of the present invention without departing from the sprit or scope of the disclosure. Thus, it is intended that the present invention covers the modifications and variations of this disclosure provided they come within the scope of the appended claims and their equivalents.

What is claimed is:
1. A light source device, comprising:
a frame including a bottom wall and a side wall surrounding the bottom wall;
a light source on the bottom wall;
a wavelength converting structure disposed over the light source and including wavelength converting mediums therein; and
a first heat sink disposed at a side of the frame to be opposite to the wavelength converting structure, wherein the wavelength converting structure is disposed on and directly contacts a top surface of the side wall of the frame, and wherein the wavelength converting structure has an uneven side surface.

2. The light source device according to claim 1, further comprising:

a thermal conductor connecting a side surface of the wavelength converting structure and the side wall of the frame.

3. The light source device according to claim 2, wherein the thermal conductor has an uneven side surface.

4. The light source device according to claim 1, further comprising:

a thermal conductor connecting a bottom surface of the wavelength converting structure and the bottom wall of the frame.

5. The light source device according to claim 1, wherein the uneven side surface of the wavelength converting structure acts as a second heat sink.

6. The light source device according to claim 1, wherein the wavelength converting structure further includes a dispersion medium transmitting a light of at least a visible light wavelength region.

7. The light source device according to claim 1, wherein the wavelength converting structure is formed of a material having a barrier property to water and oxygen.

8. The light source device according to claim 1, wherein the wavelength converting medium absorbs a photon having an energy greater than a band gap of the wavelength converting medium.

9. The light source device according to claim 1, wherein the wavelength converting mediums are quantum dots.

10. The light source device according to claim 9, wherein the quantum dots include first quantum dots and second quantum dots.

11. The light source device according to claim 10, wherein the first quantum dots are disposed between the light source and the second quantum dots.

12. The light source device according to claim 10, wherein the first and second quantum dots are grouped with each other.

13. The light source device according to claim 10, wherein when a light produced by the light source is a blue light, the first quantum dot has a light-emission center wavelength at a wavelength region of a green light, and the second quantum dot has a light-emission center wavelength at a wavelength region of a red light.

14. The light source device according to claim 10, wherein the quantum dots further include third quantum dots, and wherein when a light produced by the light source portion is a UV light, the first quantum dot has a light-emission center wavelength at a wavelength region of a green light, the second quantum dot has a light-emission center wavelength at a wavelength region of a red light, and the third quantum dot has a light-emission center wavelength at a wavelength region of a blue light.

15. The light source device according to claim 1, wherein a first light from the light source and a second light from the wavelength converting mediums are mixed such that a white light is provided from the light source device.

16. The light source device according to claim 1, wherein the wavelength converting structure has a plan area being substantially equal to the frame.

17. The light source device according to claim 1, wherein a side wall of the wavelength converting structure has a width being smaller than the side wall of the frame.

18. The display device according to claim 1, wherein the light source device further includes:

a thermal conductor connecting a side surface of the wavelength converting structure and the side wall of the frame.

19. The display device according to claim 18, wherein the thermal conductor has an uneven side surface.

20. A display device, comprising:

a display panel; and a light source device under the display panel and including:

a frame including a bottom wall and a side wall surrounding the bottom wall;

a light source on the bottom wall;

a wavelength converting structure disposed between the light source and the display panel and including wavelength converting mediums therein; and a first heat sink disposed at a side of the frame to be opposite to the wavelength converting structure, wherein the wavelength converting structure is disposed on and directly contacts a top surface of the side wall of the frame, and wherein the wavelength converting structure has an uneven side surface.

21. The display device according to claim 20, wherein the light source device further includes:

a thermal conductor connecting a bottom surface of the wavelength converting structure and the bottom wall of the frame.

22. The display device according to claim 20, wherein the uneven side surface of the wavelength converting structure acts as a second heat sink at the side surface of the wavelength converting structure.

23. The display device according to claim 20, wherein the wavelength converting structure further includes a dispersion medium transmitting a light of at least a visible light wavelength region.

24. The display device according to claim 20, wherein the wavelength converting structure is formed of a material having a barrier property to water and oxygen.

25. The display device according to claim 20, wherein the wavelength converting medium absorbs a photon having an energy greater than a band gap of the wavelength converting medium.

26. The display device according to claim 20, wherein the wavelength converting mediums are quantum dots.

27. The display device according to claim 26, wherein the quantum dots include first quantum dots and second quantum dots.

28. The display device according to claim 27, wherein the first quantum dots are disposed between the light source and the second quantum dots.

29. The display device according to claim 27, wherein the first and second quantum dots are grouped with each other.

30. The display device according to claim 27, wherein when a light produced by the light source is a blue light, the first quantum dot has a light-emission center wavelength at a wavelength region of a green light, and the second quantum dot has a light-emission center wavelength at a wavelength region of a red light.

31. The display device according to claim 27, wherein quantum dots further include third quantum dots, and wherein when a light produced by the light source portion is a UV light, the first quantum dot has a light-emission center wavelength at a wavelength region of a green light, the second quantum dot has a light-emission center wavelength at a wavelength region of a red light, and the third quantum dot has a light-emission center wavelength at a wavelength region of a blue light.

32. The display device according to claim 20, wherein a first light from the light source and a second light from the wavelength converting mediums are mixed such that a white light is provided from the light source device.

33. The display device according to claim 20, wherein the wavelength converting structure has a plan area being substantially equal to the frame.

34. The display device according to claim 20, wherein a side wall of the wavelength converting structure has a width being smaller than the side wall of the frame.

\* \* \* \* \*